United States Patent [19]
Minagawa et al.

[11] 4,334,167
[45] Jun. 8, 1982

[54] ELASTIC SURFACE WAVE DEVICE

[75] Inventors: Shoichi Minagawa; Takeshi Okamoto, both of Toda, Japan

[73] Assignee: Clarion Co., Ltd., Tokyo, Japan

[21] Appl. No.: 153,238

[22] Filed: May 27, 1980

[30] Foreign Application Priority Data

May 28, 1979 [JP] Japan .................................. 54-64923

[51] Int. Cl.³ ............................................ H01L 41/08
[52] U.S. Cl. ............................. 310/313 R; 310/313 B; 310/313 C; 310/313 D
[58] Field of Search ........... 310/313 R, 313 B, 313 C, 310/313 D; 330/5.5

[56] References Cited
U.S. PATENT DOCUMENTS 3,388,334  6/1968  Adler ............................. 310/313 R
3,633,118  1/1972  Means et al. ........................ 330/5.5
3,713,048  1/1973  Dias .................................. 330/5.5 X
3,826,932  7/1974  Wang .............................. 310/313 B
4,233,530  11/1980 Mikoshiba et al. .................. 330/5.5

Primary Examiner—Mark O. Budd
Attorney, Agent, or Firm—Blanchard, Flynn, Thiel, Boutell & Tanis

[57] ABSTRACT

An elastic surface wave device having an input electrode, a pump electrode and an output electrode provided on a body of the device. The output electrode is juxtaposed with the input electrode on the body of the device on the same side with reference to the pump electrode and a multistrip coupler is provided between the pump electrode and the input and output electrodes so as to output, through the output electrode, a backward wave signal from the pump electrode.

9 Claims, 12 Drawing Figures

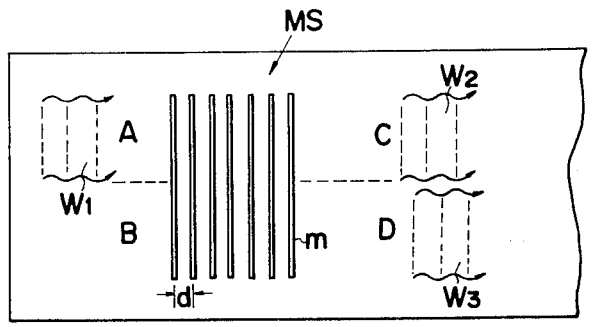
FIG. 6
FIG. 7
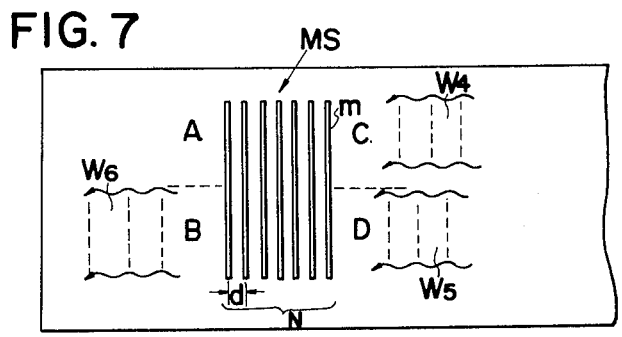
FIG. 8
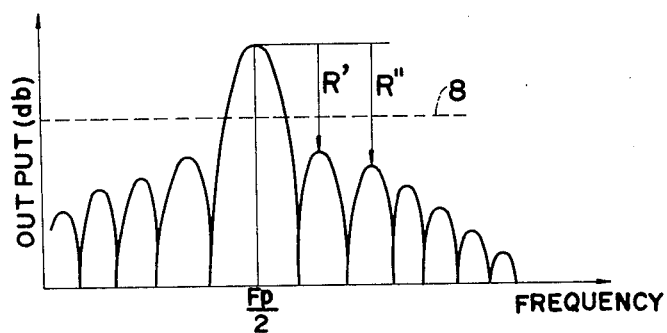
FIG. 9
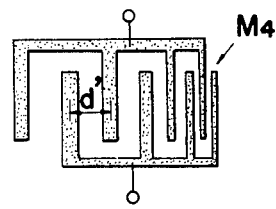

ELASTIC SURFACE WAVE DEVICE

BACKGROUND OF THE INVENTION

1. Field of the Invention

This invention relates to an elastic surface wave device utilizing a parametric amplification effect, and more particularly to an elastic surface wave device having input and output electrodes juxtaposed on the same side in relation with a pump electrode and having a multi-strip coupler interposed between said input and output electrodes and said pump electrode for deriving, through the output electrode, a backward wave signal emanating from the pump electrode to improve separation of an output signal from an input signal.

2. Description of the Prior Art

The applicant has already proposed and disclosed an elastic surface wave device having various advantages which allow an integrated formation as illustrated in FIG. 1, continuous wave operation, improvement in low frequency characteristics, etc. in Japanese patent application No. 107271/77.

In FIG. 1, numeral 1 designates a body which is formed of a laminate of a semiconductor layer 1' and a piezoelectric layer 1''. Numerals 2 and 3 designate an input electrode and an output electrode, respectively, and a pump electrode 4 is provided therebetween. Numeral 5 is an ohmic electrode, 6 a d.c. power source for applying a d.c. bias voltage, and 7 a high-frequency power source for applying a pump power.

As mentioned above, in this proposal, the pump electrode 4 is disposed between the input electrode 2 and the output electrode 3 and a surface signal wave (forward wave) passed through and amplified by the pump electrode 4 is taken out through the output electrode 3. The output waveform of this device is as illustrated in FIG. 2. In the figure, a frequency Fp/2 (Fp: a frequency of the pump power) is a center frequency of an output signal. An input signal component 8 having a frequency deviated from the center frequency Fp/2 is propagated as it is without being subjected to a parametric amplification and outputted from the output electrode 3 together with the parametrically amplified component. Due to this fact, in the previously proposed device, an amplification gain G of the parametrically amplified signal 9 and the spurious response R make little difference in magnitude and an absolute value of the amplification gain G cannot be large enough. By these reasons, the selectivity of the output signal cannot be excellent and therefore an improvement in this respect has been up for solution.

OBJECTS OF THE INVENTION

It is therefore an object of the present invention to provide an elastic surface wave device which is capable of solving the problem as mentioned above.

SUMMARY OF THE INVENTION

The present invention has been achieved based on the inventors' understanding that an elastic surface wave device generates a transmitting wave (forward wave) and a backward wave simultaneously by applying to a pump electrode a pump power of a continuous wave and that the backward wave is subjected to a parametric amplification operation as well as the forward wave, and their finding that when the backward wave is taken out as an output, an input signal component propagated straight without being subjected to a parametric amplification operation can be separated from the input signal component. To this end, an additional electrode such as a multi-strip coupler may be used for effectively outputting the backward wave.

BRIEF DESCRIPTION OF THE DRAWINGS

FIGS. 6 and 7 are explanatory plan views for explaining an operation of a multi-strip coupler employable in the device illustrated in FIG. 3;

FIG. 8 is a characteristic curve of output frequency of the device illustrated in FIG. 3;

FIG. 9 is a plan view of another form of input or output electrode alternatively applicable to the device of the present invention;

DESCRIPTION OF THE PREFERRED EMBODIMENT

The invention will now be described in detail referring to the embodiments illustrated in the accompanying drawings.

Figure 3:
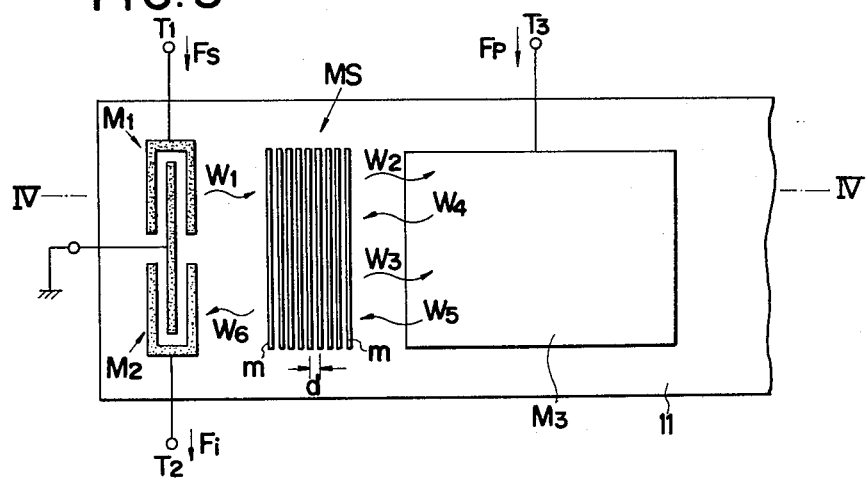
FIG. 3 is a plan view of one form of an elastic surface wave device in accordance with the present invention.
Figure 4:
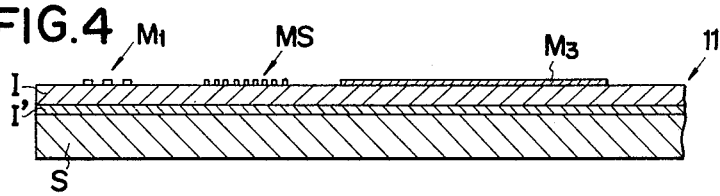
FIG. 4 is a sectional view of the device illustrated in FIG. 3, taken along a line IV—IV of FIG. 3.

FIGS. 3 and 4 illustrate one form of an elastic surface wave device embodying the present invention. In the figures, S is a semiconductor substrate made of, e.g., silicon (Si), I is a piezoelectric film which is made of a material selected from zinc oxide (ZnO), lithium niobate (LiNbO$_3$), aluminum nitride (AlN), etc. and I' is an insulating film made of silicon dioxide (SiO$_2$) etc. A body 11 of the device is made of a laminate formed of the semiconductive substrate S, the insulating film I' and the piezoelectric film I. The insulating film I' acts as a stabilizing film for a surface of the semiconductive substrate S.

Figure 5:
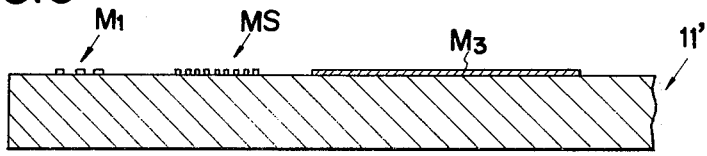
FIG. 5 is a sectional view of another form of a body employable in the device illustrated in FIG. 3.

Another type of body 11' as illustrated in FIG. 5 is also employable in the present invention. The body 11' may be formed of a monolithic block of a piezoelectric semiconductive material such as gallium arsenide (GaAs), cadmium sulfide (CdS), etc. Where the body 11' is formed of the monolithic block of piezoelectric semiconductive material, a possible problem of instability due to interfacial phenomenon in a laminate formed of a piezoelectric layer and a semiconductive layer is eliminated. In addition, the process for manufacturing the body can be simplified.

M$_1$ and M$_2$ are an input and an output electrode, respectively. These electrodes M$_1$ and M$_2$ are elastic surface wave transducers formed of comb-shaped interdigital electrodes. The output electrode M$_2$ is juxtaposed with the input electrode M$_1$ and the electrodes M$_1$ and M$_2$ are disposed on the body of the device on the same side with reference to a pump electrode $M_3$. A multi-strip coupler MS is provided at an intermediate position between the electrodes $M_1$ and $M_2$ and the pump electrode $M_3$. $T_1$ and $T_2$ are an input and an output terminal for an electric signal, respectively, and $T_3$ is a deriving terminal of the pump electrode $M_3$. The deriving terminal is connected to a d.c. power source (not shown) for a d.c. bias voltage and a high-frequency power source (not shown) for a pump power.

The multi-strip coupler MS employed in the present invention will now be described referring to FIGS. 6 and 7. The multi-strip coupler MS is formed of a plurality of strip electrodes m, m . . . disposed periodically on a propagation medium for elastic surface waves (hereinafter referred to as surface waves) at equal intervals so as to be perpendicular to a travelling direction of the surface waves. The strip electrodes m, m . . . are formed for example by metallizing, but they may be formed simultaneously with the other electrodes $M_1$, $M_2$ and $M_3$ by photo-etching or lift-off.

The multi-strip coupler MS will operate as follows, so long as the number N of the strip electrodes m, m . . . has a relation expressed by:

$$N = \frac{\lambda}{2K^2\alpha d} \cdot \left[ \frac{\sin(\theta/2)}{\theta/2} \right]^{-2}$$

where
 $\theta = 2\pi\alpha d/\lambda$
 $\lambda$: a wavelength of a surface wave
 $K^2$: a coefficient of electro-mechanical coupling of the device body
 d: a periodic repetition interval between each of the strip electrodes
 $\alpha$: an effective coefficient with respect to the periodic repetion interval d of the electrodes For explaining the operation of the multi-strip coupler MS, it is assumed that the input and the output side of the coupler MS is divided into four regions A, B, C and D as shown in FIGS. 6 and 7. When a surface wave $w_1$ is inputted to a region A (having a half width of the multi-strip coupler) as illustrated in FIG. 6, the beam width of the surface wave $w_1$ is expanded twice as much as it was through the electromechanical coupling of the piezoelectric material (the body of the device) while it is being propagated through the multi-strip coupler MS. Thus, surface waves $w_2$ and $w_3$ are outputted at regions C and D, respectively. The so outputted surface waves $w_2$ and $w_3$ have equal amplitudes, but the wave $w_3$ has a lead of phase by 90° with reference to the wave $w_2$.

On the other hand, where two waves $w_4$ and $w_5$ are inputted at the regions C and D as illustrated in FIG. 7 and the wave $w_5$ has an amplitude equal to that of the wave $w_4$ and a lead of phase by 90° with reference to the wave $w_4$, a surface wave $w_6$ is outputted only at the region B.

While the multi-strip coupler operates as mentioned above, the elastic surface wave device of the invention operates as will be mentioned below.

When an electric signal having a frequency Fs is inputted to an input terminal $T_1$ of the device illustrated in FIG. 3, the electric signal is transduced at the input electrode $M_1$ into a surface wave $W_1$ having a frequency Fs and propagated towards the multi-strip coupler MS. Then, the wave $w_1$ passes through the multi-strip coupler MS, when it is transduced into two surface wave signals $W_2$ and $W_3$. The surface waves $w_2$ and $w_3$ have the same frequency Fs and the same amplitude, but the surface wave $w_3$ has a lead of phase by 90° with reference to the wave $w_2$ (corresponding to the case of FIG. 6). The surface waves $w_2$ and $w_3$ are amplified at the pump electrode $M_3$ by a parametric interaction with a pump electric signal (frequency: Fp) applied to the pump electrode $M_3$. The amplified surface wave signal is generated in opposite directions, i.e., rightwardly and leftwardly in FIG. 3 from the pump electrode $M_3$. As signals to be generated leftwardly, i.e., as backward or reflected idler wave signals, there will be generated signals $w_4$ and $w_5$ corresponding to the surface wave signals $W_2$ and $W_3$, respectively. The idler wave signals $w_4$ and $w_5$ have the same frequency Fi ($=Fp-Fs$) and the same amplitude, but the idler wave $w_5$ has a lead of phase by 90° with the idler wave $w_4$.

When the idler waves $w_4$ and $w_5$ pass through the multi-strip coupler MS again but in the opposite direction, they are transduced into a surface wave $w_6$. The surface wave $w_6$ is propagated towards the output electrode $M_2$. The frequency of the surface wave $w_6$ is Fi (corresponding to the case of FIG. 7). Thus, the surface wave signal $w_6$ is transduced into an electric signal (frequency: Fi) at the output electrode $M_2$ and outputted through the output terminal $T_2$.

In this connection, it is to be noted that a signal to be taken out as an output from the device of the invention is the backward signal $w_6$ derived from the idler waves $w_4$ and $w_5$ generated by the parametric interaction.

Figure 1:
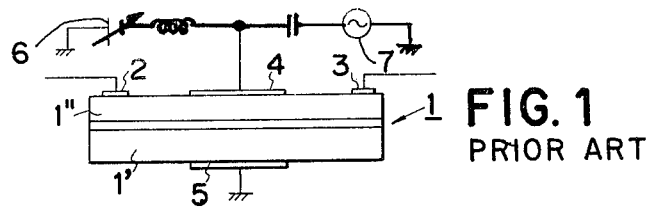
FIG. 1 is a diagrammatic side elevational view of a known elastic surface wave device.
Figure 2:
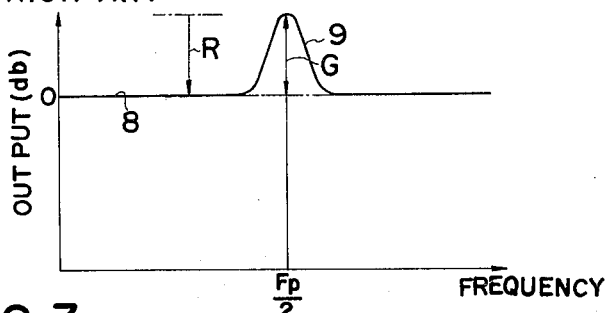
FIG. 2 is a characteristic curve of an output of the device illustrated in FIG. 1.

The frequency characteristic of the output of the backward output signal $w_6$ is as illustrated in FIG. 8. The output of the components deviated from the center frequency is extremely low and negligible because the components (components having a frequency around the center frequency Fp/2) generated by the parametric interaction at the pump electrode $M_3$ is taken out as the major output. An input signal component 8 which is not subjected to the parametric amplification and as can be seen in the output characteristic curve illustrated in FIG. 2 is not contained in the output signal. Therefore, a spurious characteristic of the device of the invention is improved very much as compared with the previous device and selectivity of the desired signal (output frequency signal) becomes excellent. In FIG. 8, the level of the signal 8 in FIG. 2 is indicated for the purpose of comparison.

If the output electrode is arranged between the input electrode and the pump electrode, i.e., the input, output and pump electrodes are arranged in series in this order without employing a multi-strip coupler as used in the device of the present invention to take out the idler wave signal as an output, an input signal is also take out from the output electrode together with the idler signal. Thus, it is impossible to take out the idler signal separately from the input signal.

FIG. 9 illustrates another form of comb-shaped electrode (elastic surface wave transducer) employable in the device of the present invention. In this electrode $M_4$, distances d' between respective teeth thereof differ from each other, i.e., decrease or increase gradually in the propagation direction of an elastic surface wave signal, so that components of relatively low frequency are effectively excited at a portion having larger distances d' (leftward portion in FIG. 9) and components of relatively high frequency are effectively excited at a portion having smaller distances d' (rightward portion in FIG. 9). Accordingly, as a whole, the electrode M₄ can be used advantageously as a wide band transducer.

Figure 10:
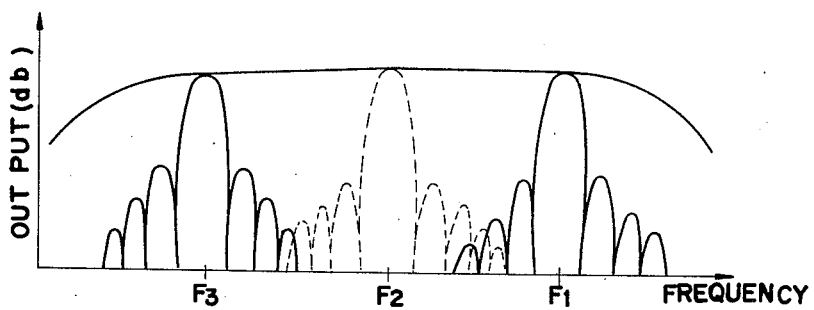
FIG. 10 is one example of a characteristic curve of output frequency of the electrode illustrated in FIG. 9.
Figure 11:
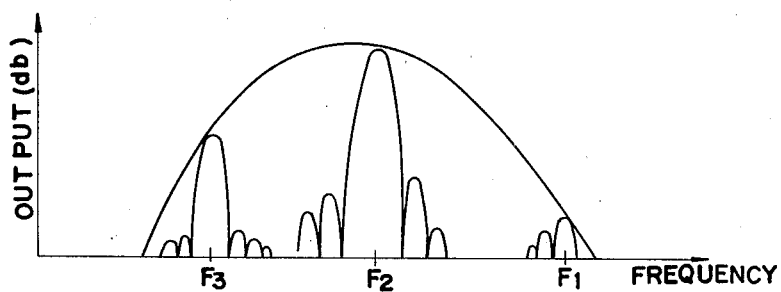
FIG. 11 is one example of a characteristic curve of frequency of each of input and output electrodes as used in the device illustrated in FIG. 3.

FIG. 10 shows one example of a frequency characteristic of the electrode M₄. In this example, a frequency of a pump electric signal is varied three ways as F₁ to F₃. When compared with a frequency characteristic of an electrode having equal intervals as shown in FIG. 11, it can be said that a transduceable band width is remarkably increased. Therefore, the comb-shaped interdigital electrode M₄ may be used in the device of the present invention to provide an elastic surface wave device of wide band and excellent in spurious characteristics.

Figure 12:
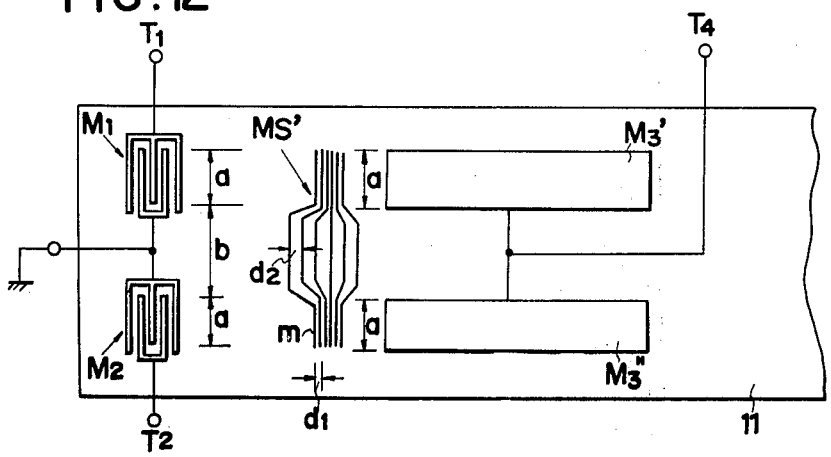
FIG. 12 is a plan view of another form of elastic surface wave device in accordance with the present invention.

FIG. 12 illustrates another embodiment of the present invention. In this embodiment, a suitable space b is provided between the input electrode M₁ and the output electrode M₂ and spacings or intervals d₂ between respective strip electrodes m of a multi-strip coupler MS' at its portion corresponding to the space b are differentiated from spacings or intervals d₁ between the respective strip electrodes m of the multi-strip coupler MS' at portions a which correspond to the input electrode M₁ and the output electrode M₂ respectively. The spacing d₂ is made larger than d₁. The spacing d₂ between each of the electrodes m at the portion corresponding to the space b is selected within a range where the sonic speed of the surface wave (acoustic wave) is not in phase with input and output signals so that the strip electrodes at the portion may not act as a multi-strip coupler. A pump electrode is divided into M₃' and M₃" so as to be adapted for the formation of the multi-strip coupler MS'. Thus, according to this embodiment, direct coupling between the input and output electrodes is reduced so that the spurious characteristics can be further improved. In addition, since beams of the surface wave can be selectively propagated only to a required portion, the beams can be utilized effectively and undesired transducing loss can be avoided. In this connection, it is to be noted that the pump electrodes M₃' and M₃" in the embodiment of FIG. 12 may be an integrated pump electrode M₃ as in FIG. 3. In FIG. 12, parts of portions same as or similar to those in FIG. 3 are denoted by the same numerals or letters as in FIG. 3.

Although a multi-strip coupler is employed in the foregoing examples as an electrode for outputting the backward wave signal through the output electrode, it may be replaced by another means having substantially same functions.

As mentioned above, in accordance with the present invention, since the input and the output electrodes are juxtaposed on the same side with reference to the pump electrode and the multi-strip coupler is provided between the pump electrode and the input and output electrodes so as to take out, as an output signal, the backward wave signal from the pump electrode, the parametrically amplified signal can be taken out with excellent separation from the input signal and the spurious characteristics can be highly improved.

Furthermore, where a suitable space is formed between the input electrode and the output electrode and the intervals between the strip electrodes of the multi-strip coupler at the portion corresponding to the space are selected so that the sonic speed of the surface wave and the input and output signals may not be in phase to form an inoperative region within the multi-strip coupler, direct coupling between the input and the output electrodes can be reduced and accordingly the spurious characteristics can be further imposed.

We claim:
1. In an elastic surface wave device comprising a body having an input electrode, an output electrode and a pump electrode provided thereon, wherein the improvement comprises: said output electrode is juxtaposed with said input electrode on the same side of said body with reference to said pump electrode and wherein a further electrode for outputting through said output electrode a backward wave signal from said pump electrode is provided at an intermediate position between said input and output electrodes and said pump electrode.

2. An elastic surface wave device as claimed in claim 1, wherein said further electrode for outputting the backward wave signal is a multi-strip coupler.

3. An elastic surface wave device as claimed in claim 2, wherein said multi-strip coupler includes a plurality of strip electrodes and the number N of said strip electrodes of said multi-strip coupler is expressed by:

$$N = \frac{\lambda}{2K^2 \alpha d} \cdot \left[ \frac{\sin(\theta/2)}{\theta/2} \right]^{-2}$$

where
$\theta = 2\pi \alpha d/\lambda$,
$\lambda$ is a wave length of an elastic surface wave,
$K^2$ is an electromechanical coupling coefficient of the body of the device,
d is the periodic repetition spacing between said strip electrodes, and
$\alpha$ is an effective coefficient with respect to the periodic repetition spacing between said strip electrodes.

4. An elastic surface wave device as claimed in claim 2 or 3, wherein said body of the device is formed of a laminate of a semiconductive material layer and a piezoelectric material layer and wherein all said electrodes are arranged on a surface portion of said piezoelectric material layer.

5. An elastic surface wave device as claimed in claim 2 or 3, wherein said body of the device is made of a piezoelectric semiconductive material.

6. An elastic surface wave device as claimed in any one of the claims 2 to 4, wherein said input and output electrodes are comb-shaped electrodes, respectively.

7. An elastic surface wave device as claimed in claim 6, wherein differing spacings are provided between respective teeth of each said comb-shaped electrode in a propagation direction of a surface wave signal.

8. An elastic surface wave device as claimed in claim 2 or claim 3, wherein a space is provided between said input electrode and said output electrode and wherein the spacing between said strip electrodes of the multi-strip coupler at a portion thereof corresponding to said space between said input electrode and said output electrode differs from the spacing between said strip electrodes of the multi-strip coupler at portions thereof corresponding to said input and output electrodes, so as to form an inoperative region at said portion of said multi-strip coupler corresponding to said space between said input electrode and said output electrode.

9. An elastic surface wave device as claimed in claim 8, wherein said pump electrode includes first and second electrodes to correspond to said input and output electrodes, respectively.

* * * * *

UNITED STATES PATENT AND TRADEMARK OFFICE
CERTIFICATE OF CORRECTION

PATENT NO. : 4 334 167
DATED : June 8, 1982
INVENTOR(S) : Shoichi MINAGAWA et al It is certified that error appears in the above—identified patent and that said Letters Patent is hereby corrected as shown below:

Column 6, line 44; delete "any".
          line 45; change "one of the claims 2 to 4" to
          ---claim 2 or claim 3---.

Column 6, line 65; after "electrodes" insert
          ---arranged---.

Signed and Sealed this

Twelfth Day of October 1982

[SEAL]

Attest:

GERALD J. MOSSINGHOFF

Attesting Officer     Commissioner of Patents and Trademarks